(12) United States Patent
Lv (10) Patent No.: US 9,553,198 B1
(45) Date of Patent: Jan. 24, 2017

(54) TFT SUBSTRATE STRUCTURE AND MANUFACTURING METHOD THEREOF

(71) Applicant: Shenzhen China Star Optoelectronics Technology Co., Ltd., Shenzhen (CN)

(72) Inventor: Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/778,087

(22) PCT Filed: Jul. 27, 2015

(86) PCT No.: PCT/CN2015/085157
§ 371 (c)(1),
(2) Date: Sep. 18, 2015

(51) Int. Cl.
*H01L 29/786* (2006.01)
*H01L 29/66* (2006.01)
*H01L 29/49* (2006.01)
*H01L 29/45* (2006.01)

(52) U.S. Cl.
CPC ....... *H01L 29/78669* (2013.01); *H01L 29/458* (2013.01); *H01L 29/4908* (2013.01); *H01L 29/66765* (2013.01)

(58) Field of Classification Search
CPC ........... H01L 29/78669; H01L 29/4908; H01L 29/458; H01L 29/66765
See application file for complete search history.

(56) References Cited

U.S. PATENT DOCUMENTS

2008/0105871 A1* 5/2008 Yan ................ H01L 29/66765
257/58

* cited by examiner

*Primary Examiner* — Kyoung Lee
(74) *Attorney, Agent, or Firm* — Leong C. Lei (57) ABSTRACT

The present invention provides a TFT substrate structure and a manufacturing method thereof. The TFT substrate structure of the present invention includes an N-type lightly-doped amorphous silicon layer and an N-type heavily-doped amorphous silicon layer arranged between an amorphous silicon layer and a metal layer to form a gradient of doping concentration so as to reduce the potential barrier between the metal layer and the amorphous silicon layer, making injection of electrons easy and reducing the leakage current without lowering an operation current, thereby improving the electrical property of the TFT. The manufacturing method of a TFT substrate structure of the present invention includes forming an N-type lightly-doped amorphous silicon layer and an N-type heavily-doped amorphous silicon layer between an amorphous silicon layer and a metal layer to effectively reduce the potential barrier between the metal layer and the amorphous silicon layer, making injection of electrons easy and reducing the leakage current without lowering an operation current, thereby improving the electrical property of the TFT.

12 Claims, 6 Drawing Sheets

TFT SUBSTRATE STRUCTURE AND MANUFACTURING METHOD THEREOF

BACKGROUND OF THE INVENTION

1. Field of the Invention

The present invention relates to the field of display technology, and in particular to a thin-film-transistor (TFT) substrate structure and a manufacturing method thereof.

2. The Related Arts

Amorphous silicon (a-Si) is the most widely used semiconductor material in the semiconductor industry. The a-Si material shows a great potential difference when put in contact with metals, making it hard to form an ohmic contact. In practical applications, in order to make an ohmic contact between a metal and a semiconductor, it is commonplace to heavily dope element P in a surface of the semiconductor for lowering the contact resistance between the metal and the semiconductor and increasing current efficiency.

Figure 1:
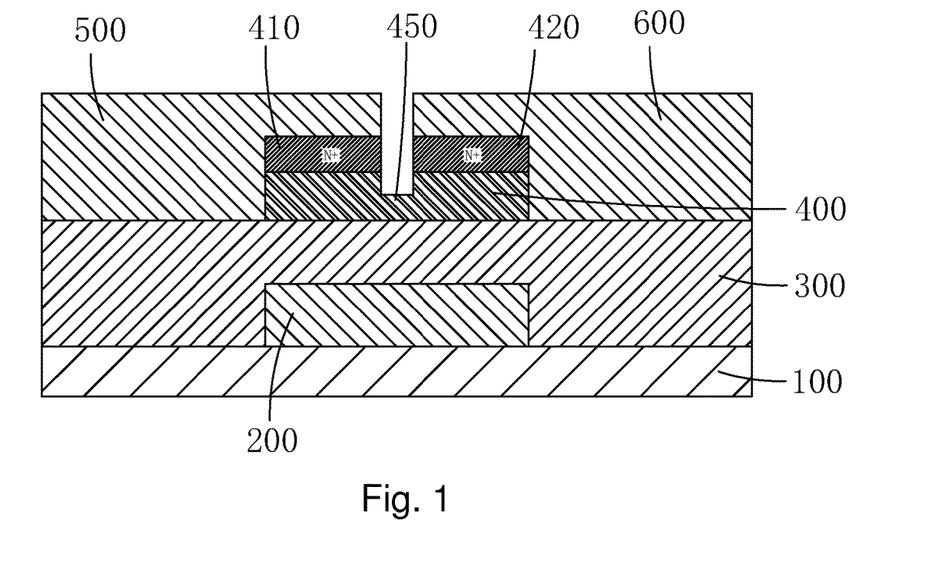
FIG. 1 is a schematic view, in a sectioned form, showing a conventional thin-film transistor (TFT) substrate structure.

FIG. 1 is a schematic view, in a sectioned form, showing a conventional thin-film transistor (TFT) substrate structure. The TFT substrate structure comprises a base plate 100, a gate terminal 200 formed on the base plate 100, a gate insulation layer 300 formed on the base plate 100 and covering the gate terminal 200, an amorphous silicon layer 400 formed on the gate insulation layer 300 to be located above and correspond to the gate terminal 200, and a source terminal 500 and a drain terminal 600 formed on the gate insulation layer 300 and respectively contacting two side portions of the amorphous silicon layer 400. The amorphous silicon layer 400 comprises a channel zone 450 formed therein to correspond to the gate terminal 200. The amorphous silicon layer 400 has a surface that is formed with first and second N-type heavily-doped zones 410, 420 respectively corresponding to two sides of the channel zone 450. The source terminal 500 and the drain terminal 600 are respectively set in contact with the surfaces of the first and second N-type heavily-doped zones 410, 420.

Figure 2:
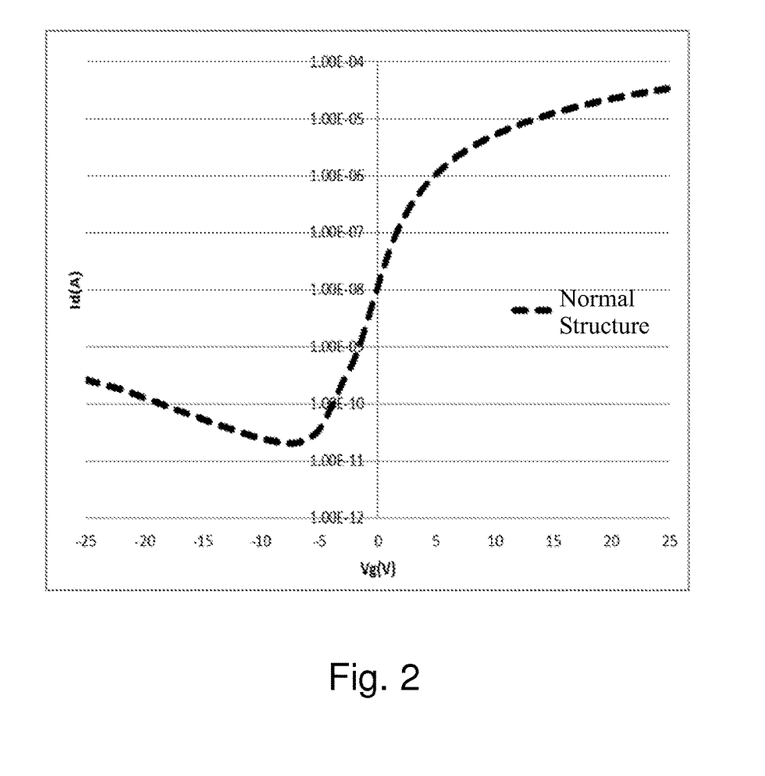
FIG. 2 shows a curve of a leakage current of an amorphous silicon (a-Si) device involving the TFT substrate structure of FIG. 1.

FIG. 2 is a curve illustrating a leakage current Ioff of an a-Si device involving the TFT substrate structure of FIG. 1 varying with a gate voltage Vg. It is known from FIG. 2 that certain problems exist when an operation current (Ion) of the TFT substrate structure is increased. When the loading voltage reaches a predetermined level, positive charges are induced so as to generate a hole-conducting channel. The leakage current (Ioff) is thus increased, making the curve severely bent and leading to a reliability issue.

Thus, it is desired to provide a TFT substrate structure and a manufacturing method thereof that overcome the above problems.

SUMMARY OF THE INVENTION

An object of the present invention is to provide a thin-film transistor (TFT) substrate structure, in which a reduced potential barrier is present between a metal layer and an amorphous silicon layer and a leakage current is relatively low.

Another object of the present invention is to provide a manufacturing method of a TFT substrate structure, which effectively reduces a potential barrier between a metal layer and an amorphous silicon layer, making injection of electrons easy and reducing leakage current without lowering an operation current, thereby improving the electrical property of a TFT.

To achieve the above objects, the present invention provides a TFT substrate structure, which comprises a base plate, a gate terminal formed on the base plate, a gate insulation layer formed on the base plate and covering the gate terminal, an island-like semiconductor layer formed on the gate insulation layer to be located above and corresponding to the gate terminal, and a source terminal and a drain terminal formed on the gate insulation layer to respectively contact two side portions of the island-like semiconductor layer;

wherein the island-like semiconductor layer comprises, stacked from bottom to top, an amorphous silicon layer, an N-type lightly-doped amorphous silicon layer, and an N-type heavily-doped amorphous silicon layer, the island-like semiconductor layer comprising a U-shaped trough formed therein in such a way that the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough; and the source terminal and the drain terminal are respectively in contact with surfaces of the first and second N-type heavily-doped amorphous silicon layers.

The N-type lightly-doped amorphous silicon layer and the N-type heavily-doped amorphous silicon layer are doped with impurities comprising element P.

The N-type heavily-doped amorphous silicon layer is doped with P atoms at a concentration that is twice of a concentration of P atoms doped in the N-type lightly-doped amorphous silicon layer.

The base plate comprises a glass board or a plastic board and the gate terminal comprises a material of one of molybdenum, titanium, aluminum, and copper or a stacked combination of multiple ones thereof.

The gate insulation layer is formed of a material of silicon oxide, silicon nitride, or a combination thereof and the source terminal and the drain terminal comprise a material of one of molybdenum, titanium, aluminum, and copper or a stacked combination of multiple ones thereof.

The present invention also provides a TFT substrate structure, which comprises a base plate, a gate terminal formed on the base plate, a gate insulation layer formed on the base plate and covering the gate terminal, an island-like semiconductor layer formed on the gate insulation layer to be located above and corresponding to the gate terminal, and a source terminal and a drain terminal formed on the gate insulation layer to respectively contact two side portions of the island-like semiconductor layer;

wherein the island-like semiconductor layer comprises, stacked from bottom to top, an amorphous silicon layer, an N-type lightly-doped amorphous silicon layer, and an N-type heavily-doped amorphous silicon layer, the island-like semiconductor layer comprising a U-shaped trough formed therein in such a way that the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough; and the source terminal and the drain terminal are respectively in contact with surfaces of the first and second N-type heavily-doped amorphous silicon layers;

wherein the N-type lightly-doped amorphous silicon layer and the N-type heavily-doped amorphous silicon layer are doped with impurities comprising element P;

wherein the N-type heavily-doped amorphous silicon layer is doped with P atoms at a concentration that is twice of a concentration of P atoms doped in the N-type lightly-doped amorphous silicon layer; and wherein the base plate comprises a glass board or a plastic board and the gate terminal comprises a material of one of molybdenum, titanium, aluminum, and copper or a stacked combination of multiple ones thereof.

The present invention further provides a manufacturing method of a TFT substrate structure, which comprises the following steps:

(1) providing a base plate and depositing a first metal layer on the base plate and subjecting the first metal layer to patterning in order to form a gate terminal;

(2) depositing a gate insulation layer on the base plate in such a way that the gate insulation layer covers the gate terminal;

(3) applying chemical vapor deposition to sequentially deposit an amorphous silicon layer, an N-type lightly-doped amorphous silicon layer, and an N-type heavily-doped amorphous silicon layer on the gate insulation layer;

(4) applying a photolithographic process to subject the amorphous silicon layer, the N-type lightly-doped amorphous silicon layer, and the N-type heavily-doped amorphous silicon layer to patterning in order to form the island-like semiconductor layer located above the gate terminal, wherein the island-like semiconductor layer comprises an amorphous silicon layer, an N-type lightly-doped amorphous silicon layer, and an N-type heavily-doped amorphous silicon layer that are located above and correspond to the gate terminal;

(5) depositing a second metal layer on the gate insulation layer and the island-like semiconductor layer and then, coating a photoresist layer on the second metal layer and using a mask to subject the photoresist layer to exposure and development to form a strip-like passage in a middle portion of the photoresist layer and extending completely through a front and a rear thereof;

(6) using the photoresist layer as shielding to subject the second metal layer to wet etching in order to form a source terminal and a drain terminal respectively corresponding to two sides of the strip-like passage; and (7) using the photoresist layer and the source and drain terminals as an etch stop layer to subject the island-like semiconductor layer to dry etching so as to form a U-shaped trough in the island-like semiconductor layer to correspond to the strip-like passage, wherein the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough, the source terminal and the drain terminal being respectively in contact with surfaces of the first and second N-type heavily-doped amorphous silicon layers, and peeling off the photoresist layer located on the source and drain terminals after the dry etching of the island-like semiconductor layer is completed.

In step (3), $SiH_4$ gas is used for the deposition of the amorphous silicon layer and $PH_3$ and $SiH_4$ gases are used for the deposition of the N-type lightly-doped amorphous silicon layer and the N-type heavily-doped amorphous silicon layer.

In the deposition of the N-type lightly-doped amorphous silicon layer, a ratio between gas flowrates of $PH_3$ and $SiH_4$ is less than 0.5 and in the deposition of the N-type heavily-doped amorphous silicon layer, a ratio between gas flowrates of $PH_3$ and $SiH_4$ is greater than 1.

The base plate comprises a glass board or a plastic board and the gate terminal comprise a material of one of molybdenum, titanium, aluminum, and copper or a stacked combination of multiple ones thereof.

The gate insulation layer is formed of a material of silicon oxide, silicon nitride, or a combination thereof and the source terminal and the drain terminal comprise a material of one of molybdenum, titanium, aluminum, and copper or a stacked combination of multiple ones thereof.

The efficacy of the present invention is that the present invention provides a TFT substrate structure, which comprises an N-type lightly-doped amorphous silicon layer and an N-type heavily-doped amorphous silicon layer arranged between an amorphous silicon layer and a metal layer to form a gradient of doping concentration so as to reduce the potential barrier between the metal layer and the amorphous silicon layer, making injection of electrons easy and reducing the leakage current without lowering an operation current, thereby improving the electrical property of the TFT. The present invention provides a manufacturing method of a TFT substrate structure, which comprises forming an N-type lightly-doped amorphous silicon layer and an N-type heavily-doped amorphous silicon layer between an amorphous silicon layer and a metal layer to effectively reduce the potential barrier between the metal layer and the amorphous silicon layer, making injection of electrons easy and reducing the leakage current without lowering an operation current, thereby improving the electrical property of the TFT.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
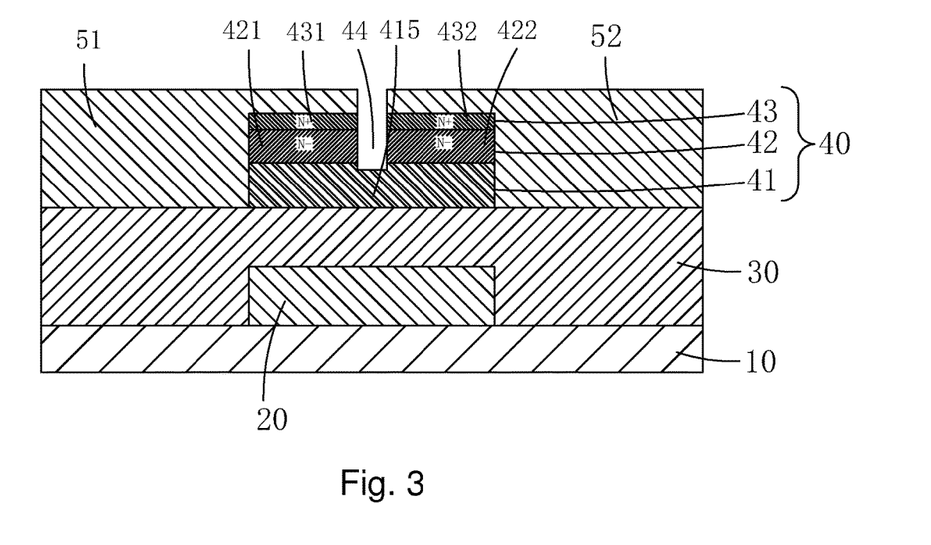
FIG. 3 is a schematic view, in a sectioned form, illustrating a TFT substrate structure according to the present invention.

Referring to FIG. 3, firstly, the present invention provides a thin-film transistor (TFT) substrate structure, which comprises a base plate 10, a gate terminal 20 formed on the base plate 10, a gate insulation layer 30 formed on the base plate 10 and covering the gate terminal 20, an island-like semiconductor layer 40 formed on the gate insulation layer 30 to be located above and corresponding to the gate terminal 20, and a source terminal 51 and a drain terminal 52 formed on the gate insulation layer 30 to respectively contact two side portions of the island-like semiconductor layer 40.

The island-like semiconductor layer 40 comprises, stacked from bottom to top, an amorphous silicon layer 41, an N-type lightly-doped amorphous silicon layer 42, and an N-type heavily-doped amorphous silicon layer 43. The island-like semiconductor layer 40 comprises a U-shaped trough 44 formed therein in such a way that the U-shaped trough 44 extends completely through the N-type lightly-doped amorphous silicon layer 43 and the N-type heavily-doped amorphous silicon layer 42 so as to divide the N-type heavily-doped amorphous silicon layer 43 into first and second N-type heavily-doped amorphous silicon layers 431, 432 respectively on two sides of the U-shaped trough 44 and to divide the N-type lightly-doped amorphous silicon layer 42 into first and second N-type lightly-doped amorphous silicon layers 421, 422 respectively on the two sides of the U-shaped trough 44 and also to form a channel 415 in the amorphous silicon layer 41 at a location under and corresponding to the U-shaped trough 44.

The source terminal 51 and the drain terminal 52 are respectively in contact with surfaces of the first and second N-type heavily-doped amorphous silicon layers 431, 432.

Specifically, the base plate 10 may comprises a glass board or a plastic board.

Specifically, the gate terminal 20, the source terminal 51, and the drain terminal 52 each comprise a material of one of molybdenum, titanium, aluminum, and copper or a stacked combination of multiple ones thereof.

Specifically, the gate insulation layer 30 comprises a material of silicon oxide, silicon nitride, or a combination thereof.

Specifically, the N-type lightly-doped amorphous silicon layer 42 and the N-type heavily-doped amorphous silicon layer 43 are doped with impurities that are element P. Preferably, the N-type heavily-doped amorphous silicon layer 43 is doped with P atoms at a concentration that is twice of concentration of P atoms doped in the N-type lightly-doped amorphous silicon layer 42.

Figure 4:
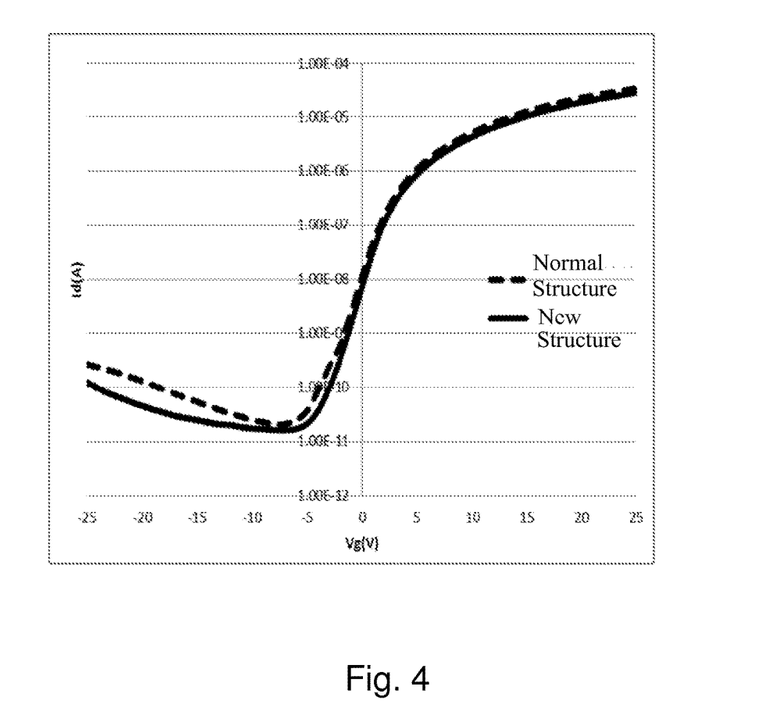
FIG. 4 shows a comparison between a curve of a leakage current of an a-Si device involving the TFT substrate structure of FIG. 3 and a curve of a leakage current of an a-Si device involving the TFT substrate structure of FIG. 1.

FIG. 4 shows a comparison between a curve of a leakage current of an amorphous silicon (a-Si) device involving the TFT substrate structure illustrated in FIG. 3 and a curve of a leakage current of an a-Si device involving a TFT substrate structure of FIG. 1, wherein a phantom curve illustrates the leakage current Ioff of the a-Si device of the TFT substrate structure of FIG. 1 varying with a gate voltage Vg, while a solid line illustrates the leakage current Ioff of the a-Si device of the TFT substrate structure of FIG. 3 varying with a gate voltage Vg. FIG. 4 shows compared to the a-Si device including the TFT substrate structure of FIG. 1 (the prior art), the a-Si device including the TFT substrate structure of FIG. 3 (the present invention) has a reduced leakage current Ioff and the bending of the curve is alleviated, thereby improving the reliability of the a-Si device. In the above-described TFT substrate structure, an N-type lightly-doped amorphous silicon layer and an N-type heavily-doped amorphous silicon layer are arranged between the amorphous silicon layer and the metal layer to provide a gradient of doping concentration, so that a potential barrier between the metal layer and the amorphous silicon layer is reduced to make injection of electrons easy and reduce the leakage current without lowering an operation current, thereby improving the electrical property of the TFT.

Figure 5:
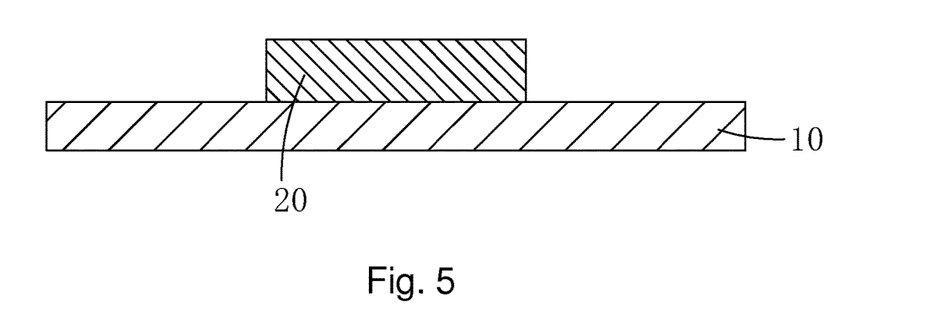
FIG. 5 is a schematic view illustrating a first step of a manufacturing method of a TFT substrate structure according to the present invention.

The present invention also provides a manufacturing method of the above-described TFT substrate structure, which comprises the following steps:

Step 1: as shown in FIG. 5, providing a base plate 10 and depositing a first metal layer on the base plate 10 and subjecting the first metal layer to patterning in order to form a gate terminal 20.

Specifically, the base plate 10 may comprise a glass board or a plastic board.

Specifically, the gate terminal 20 comprises a material of one of molybdenum, titanium, aluminum, and copper or a stacked combination of multiple ones thereof.

Figure 6:
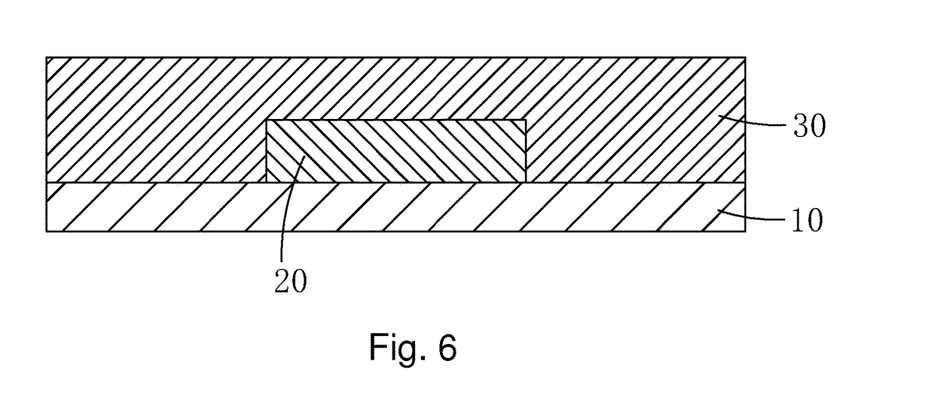
FIG. 6 is a schematic view illustrating a second step of the manufacturing method of the TFT substrate structure according to the present invention.

Step 2: as shown in FIG. 6, depositing a gate insulation layer 30 on the base plate 10 in such a way that the gate insulation layer 30 covers the gate terminal 20.

Specifically, the gate insulation layer 30 comprises a material of silicon oxide, silicon nitride, or a combination thereof.

Figure 7:
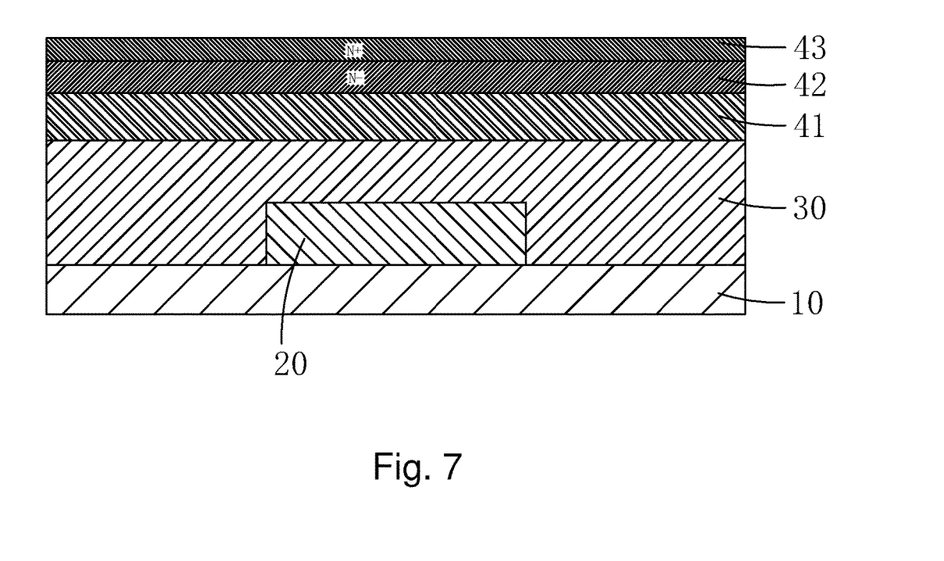
FIG. 7 is a schematic view illustrating a third step of the manufacturing method of the TFT substrate structure according to the present invention.

Step 3: as shown in FIG. 7, applying chemical vapor deposition to sequentially deposit an amorphous silicon layer 41, an N-type lightly-doped amorphous silicon layer 42, and an N-type heavily-doped amorphous silicon layer 43 on the gate insulation layer 30.

Specifically, $SiH_4$ gas is used for the deposition of the amorphous silicon layer 41 and $PH_3$ and $SiH_4$ gases are used for the deposition of the N-type lightly-doped amorphous silicon layer 42 and the N-type heavily-doped amorphous silicon layer 43.

Preferably, in the deposition of the N-type lightly-doped amorphous silicon layer 42, a ratio between gas flowrates of $PH_3$ and $SiH_4$ is <0.5 and in the deposition of the N-type heavily-doped amorphous silicon layer 43, a ratio between gas flowrates of $PH_3$ and $SiH_4$ is >1 so that the concentration of P atoms doped in the N-type heavily-doped amorphous silicon layer 43 is twice the concentration of P atoms doped in the N-type lightly-doped amorphous silicon layer 42 in Step 3.

Figure 8:
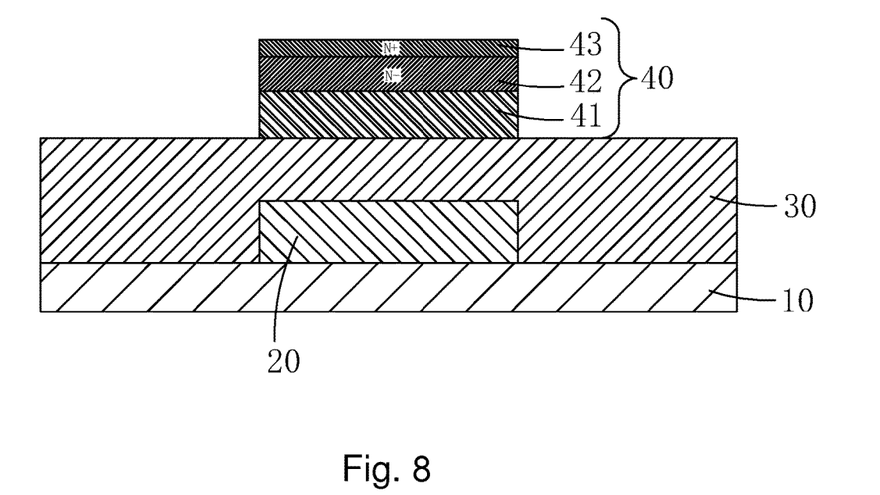
FIG. 8 is a schematic view illustrating a fourth step of the manufacturing method of the TFT substrate structure according to the present invention.

Step 4: as shown in FIG. 8, applying a photolithographic process to subject the amorphous silicon layer 41, the N-type lightly-doped amorphous silicon layer 42, and the N-type heavily-doped amorphous silicon layer 43 to patterning in order to form the island-like semiconductor layer 40 located above the gate terminal 20, wherein the island-like semiconductor layer 40 comprises an amorphous silicon layer 41, an N-type lightly-doped amorphous silicon layer 42, and an N-type heavily-doped amorphous silicon layer 43 that are located above and correspond to the gate terminal 20.

Figure 9:
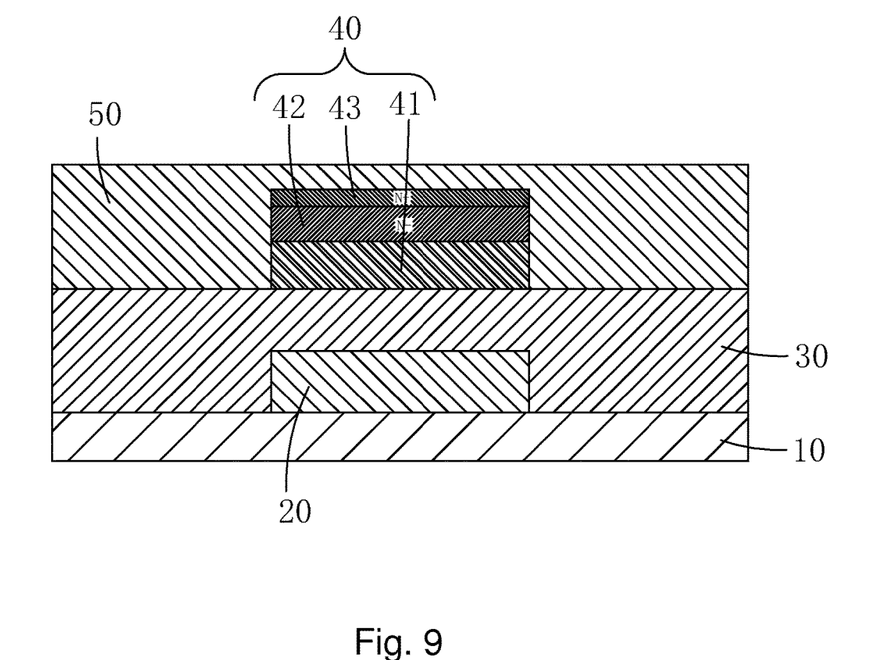
FIGS. 9 and 10 are schematic views illustrating a fifth step of the manufacturing method of the TFT substrate structure according to the present invention.
Figure 10:
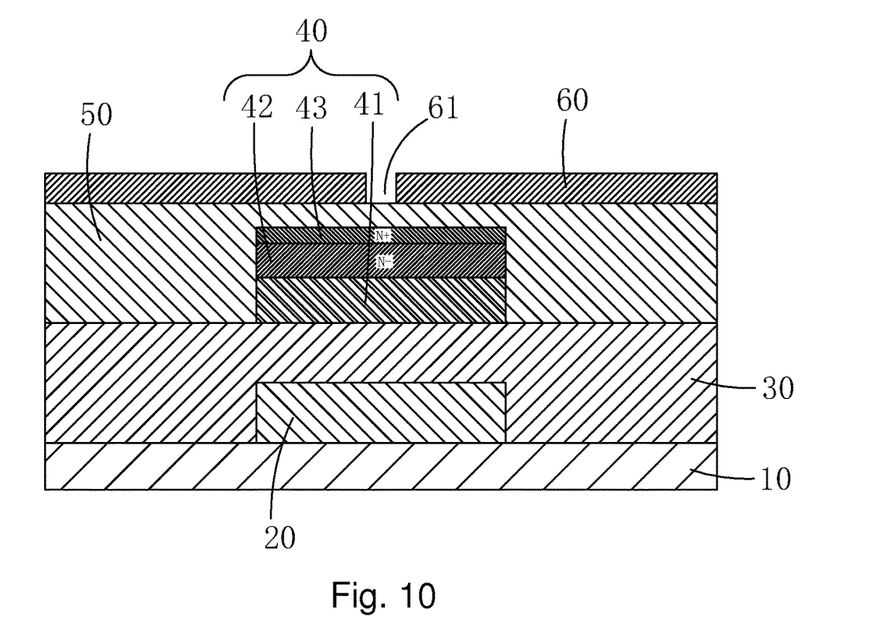

Step 5: as shown in FIGS. 9 and 10, depositing a second metal layer 50 on the gate insulation layer 30 and the island-like semiconductor layer 40 and then, coating a photoresist layer 60 on the second metal layer 50 and using a mask to subject the photoresist layer 60 to exposure and development to form a strip-like passage 61 in a middle portion of the photoresist layer 60 and extending completely through a front and a rear thereof.

Figure 11:
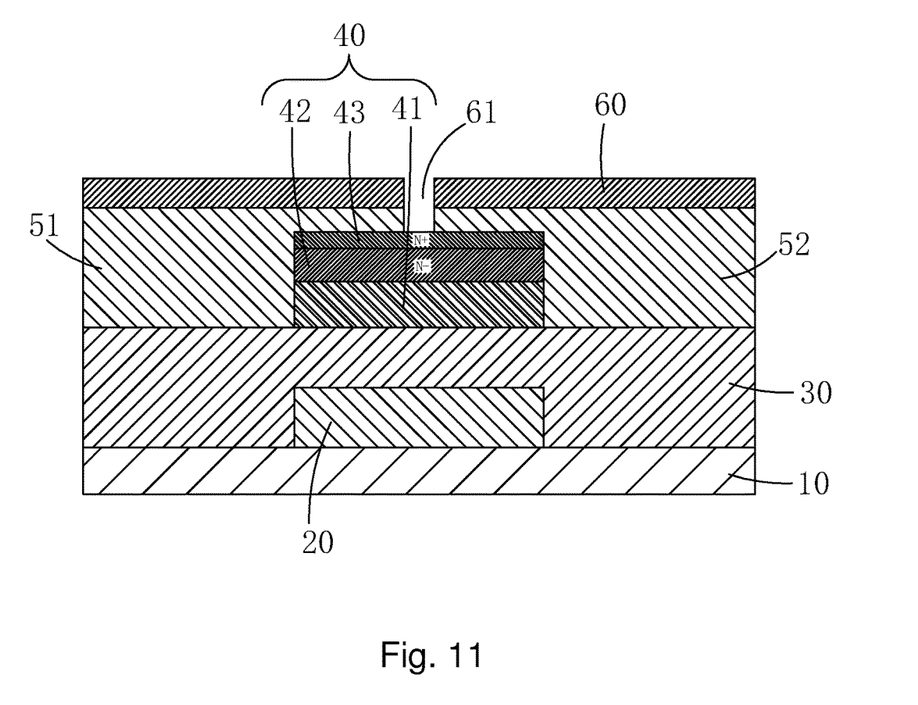
FIG. 11 is a schematic view illustrating a sixth step of the manufacturing method of the TFT substrate structure according to the present invention.

Step 6: as shown in FIG. 11, using the photoresist layer 60 as shielding to subject the second metal layer 50 to wet etching in order to form a source terminal 51 and a drain terminal 52 respectively corresponding to two sides of the strip-like passage 61.

Specifically, the source terminal 51 and the drain terminal 52 comprise a material of one of molybdenum, titanium, aluminum, and copper or a stacked combination of multiple ones thereof.

Figure 12:
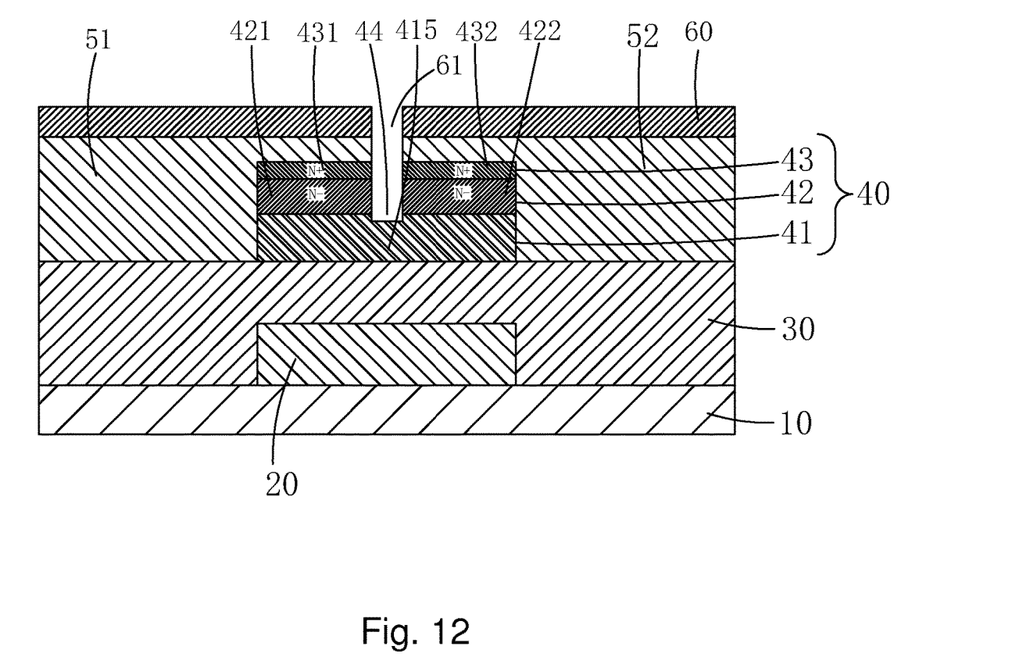
FIG. 12 is a schematic view illustrating a seventh step of the manufacturing method of the TFT substrate structure according to the present invention.

Step 7: as shown in FIG. 12, using the photoresist layer 60 and the source and drain terminals 51, 52 as an etch stop layer to subject the island-like semiconductor layer 40 to dry etching so as to form a U-shaped trough 44 in the island-like semiconductor layer 40 to correspond to the strip-like passage 61, wherein the U-shaped trough 44 extends completely through the N-type lightly-doped amorphous silicon layer 42 and the N-type heavily-doped amorphous silicon layer 43 so as to divide the N-type heavily-doped amorphous silicon layer 43 into first and second N-type heavily-doped amorphous silicon layers 431, 432 respectively on two sides of the U-shaped trough 44 and to divide the N-type lightly-doped amorphous silicon layer 42 into first and second N-type lightly-doped amorphous silicon layers 421, 422 respectively on the two sides of the U-shaped trough 44 and also to form a channel 415 in the amorphous silicon layer 41 at a location under and corresponding to the U-shaped trough 44. The source terminal 51 and the drain terminal 52 are respectively in contact with surfaces of the first and second N-type heavily-doped amorphous silicon layers 43, 44, and peeling off the photoresist layer 60 located on the source and drain terminals 51, 52, after the dry etching of the island-like semiconductor layer 40 is completed, in order to obtain the TFT substrate structure illustrated in FIG. 3.

In the above-described manufacturing method of a TFT substrate structure, a gradient of doping concentration is formed by forming an N-type lightly-doped amorphous silicon layer and an N-type heavily-doped amorphous silicon layer between an amorphous silicon layer and a metal layer so as to effectively reduce the potential barrier between the metal layer and the amorphous silicon layer, making injection of electrons easy and reducing the leakage current without lowering an operation current, thereby improving the electrical property of the TFT.

In summary, the present invention provides a TFT substrate structure, which comprises an N-type lightly-doped amorphous silicon layer and an N-type heavily-doped amorphous silicon layer arranged between an amorphous silicon layer and a metal layer to form a gradient of doping concentration so as to reduce the potential barrier between the metal layer and the amorphous silicon layer, making injection of electrons easy and reducing the leakage current without lowering an operation current, thereby improving the electrical property of the TFT. The present invention provides a manufacturing method of a TFT substrate structure, which comprises forming an N-type lightly-doped amorphous silicon layer and an N-type heavily-doped amorphous silicon layer between an amorphous silicon layer and a metal layer to effectively reduce the potential barrier between the metal layer and the amorphous silicon layer, making injection of electrons easy and reducing the leakage current without lowering an operation current, thereby improving the electrical property of the TFT.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate structure, comprising a base plate, a gate terminal formed on the base plate, a gate insulation layer formed on the base plate and covering the gate terminal, an island-like semiconductor layer formed on the gate insulation layer to be located above and corresponding to the gate terminal, and a source terminal and a drain terminal formed on the gate insulation layer to respectively contact two side portions of the island-like semiconductor layer, wherein the island-like semiconductor layer comprises, stacked from bottom to top, an amorphous silicon layer, an N-type lightly-doped amorphous silicon layer, and an N-type heavily-doped amorphous silicon layer, the island-like semiconductor layer comprising a U-shaped trough formed therein in such a way that the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough; and the source terminal and the drain terminal are respectively in contact with surfaces of the first and second N-type heavily-doped amorphous silicon layers.

2. The TFT substrate structure as claimed in claim 1, wherein the N-type lightly-doped amorphous silicon layer and the N-type heavily-doped amorphous silicon layer are doped with impurities comprising element P.

3. The TFT substrate structure as claimed in claim 1, wherein the N-type heavily-doped amorphous silicon layer is doped with P atoms at a concentration that is twice of a concentration of P atoms doped in the N-type lightly-doped amorphous silicon layer.

4. The TFT substrate structure as claimed in claim 1, wherein the base plate comprises a glass board or a plastic board and the gate terminal comprises a material of one of molybdenum, titanium, aluminum, and copper or a stacked combination of multiple ones thereof.

5. The TFT substrate structure as claimed in claim 1, wherein the gate insulation layer is formed of a material of silicon oxide, silicon nitride, or a combination thereof and the source terminal and the drain terminal comprise a material of one of molybdenum, titanium, aluminum, and copper or a stacked combination of multiple ones thereof.

6. A thin-film transistor (TFT) substrate structure, comprising a base plate, a gate terminal formed on the base plate, a gate insulation layer formed on the base plate and covering the gate terminal, an island-like semiconductor layer formed on the gate insulation layer to be located above and corresponding to the gate terminal, and a source terminal and a drain terminal formed on the gate insulation layer to respectively contact two side portions of the island-like semiconductor layer;
wherein the island-like semiconductor layer comprises, stacked from bottom to top, an amorphous silicon layer, an N-type lightly-doped amorphous silicon layer, and an N-type heavily-doped amorphous silicon layer, the island-like semiconductor layer comprising a U-shaped trough formed therein in such a way that the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough; and
the source terminal and the drain terminal are respectively in contact with surfaces of the first and second N-type heavily-doped amorphous silicon layers;
wherein the N-type lightly-doped amorphous silicon layer and the N-type heavily-doped amorphous silicon layer are doped with impurities comprising element P;
wherein the N-type heavily-doped amorphous silicon layer is doped with P atoms at a concentration that is twice of a concentration of P atoms doped in the N-type lightly-doped amorphous silicon layer; and
wherein the base plate comprises a glass board or a plastic board and the gate terminal comprises a material of one of molybdenum, titanium, aluminum, and copper or a stacked combination of multiple ones thereof.

7. The TFT substrate structure as claimed in claim 6, wherein the gate insulation layer is formed of a material of silicon oxide, silicon nitride, or a combination thereof and the source terminal and the drain terminal comprise a material of one of molybdenum, titanium, aluminum, and copper or a stacked combination of multiple ones thereof.

8. A manufacturing method of a thin-film transistor (TFT) substrate structure, comprising the following steps:
(1) providing a base plate and depositing a first metal layer on the base plate and subjecting the first metal layer to patterning in order to form a gate terminal;
(2) depositing a gate insulation layer on the base plate in such a way that the gate insulation layer covers the gate terminal;
(3) applying chemical vapor deposition to sequentially deposit an amorphous silicon layer, an N-type lightly-doped amorphous silicon layer, and an N-type heavily-doped amorphous silicon layer on the gate insulation layer;
(4) applying a photolithographic process to subject the amorphous silicon layer, the N-type lightly-doped amorphous silicon layer, and the N-type heavily-doped amorphous silicon layer to patterning in order to form the island-like semiconductor layer located above the gate terminal, wherein the island-like semiconductor layer comprises an amorphous silicon layer, an N-type lightly-doped amorphous silicon layer, and an N-type heavily-doped amorphous silicon layer that are located above and correspond to the gate terminal;
(5) depositing a second metal layer on the gate insulation layer and the island-like semiconductor layer and then, coating a photoresist layer on the second metal layer and using a mask to subject the photoresist layer to exposure and development to form a strip-like passage in a middle portion of the photoresist layer and extending completely through a front and a rear thereof;
(6) using the photoresist layer as shielding to subject the second metal layer to wet etching in order to form a source terminal and a drain terminal respectively corresponding to two sides of the strip-like passage; and
(7) using the photoresist layer and the source and drain terminals as an etch stop layer to subject the island-like semiconductor layer to dry etching so as to form a U-shaped trough in the island-like semiconductor layer to correspond to the strip-like passage, wherein the U-shaped trough extends completely through the N-type lightly-doped amorphous silicon layer and the N-type heavily-doped amorphous silicon layer so as to divide the N-type heavily-doped amorphous silicon layer into first and second N-type heavily-doped amorphous silicon layers respectively on two sides of the U-shaped trough and to divide the N-type lightly-doped amorphous silicon layer into first and second N-type lightly-doped amorphous silicon layers respectively on the two sides of the U-shaped trough and also to form a channel in the amorphous silicon layer at a location under and corresponding to the U-shaped trough, the source terminal and the drain terminal being respectively in contact with surfaces of the first and second N-type heavily-doped amorphous silicon layers, and peeling off the photoresist layer located on the source and drain terminals after the dry etching of the island-like semiconductor layer is completed.

9. The manufacturing method of the TFT substrate structure as claimed in claim 8, wherein in step (3), $SiH_4$ gas is used for the deposition of the amorphous silicon layer and $PH_3$ and $SiH_4$ gases are used for the deposition of the N-type lightly-doped amorphous silicon layer and the N-type heavily-doped amorphous silicon layer.

10. The manufacturing method of the TFT substrate structure as claimed in claim 9, wherein in the deposition of the N-type lightly-doped amorphous silicon layer, a ratio between gas flowrates of $PH_3$ and $SiH_4$ is less than 0.5 and in the deposition of the N-type heavily-doped amorphous silicon layer, a ratio between gas flowrates of $PH_3$ and $SiH_4$ is greater than 1.

11. The manufacturing method of the TFT substrate structure as claimed in claim 8, wherein the base plate comprises a glass board or a plastic board and the gate terminal comprise a material of one of molybdenum, titanium, aluminum, and copper or a stacked combination of multiple ones thereof.

12. The manufacturing method of the TFT substrate structure as claimed in claim 8, wherein the gate insulation layer is formed of a material of silicon oxide, silicon nitride, or a combination thereof and the source terminal and the drain terminal comprise a material of one of molybdenum, titanium, aluminum, and copper or a stacked combination of multiple ones thereof.

* * * * *